(12) United States Patent
Liu et al.

(10) Patent No.: US 11,201,303 B2
(45) Date of Patent: Dec. 14, 2021

(54) FLEXIBLE DISPLAY PANEL, METHOD FOR MANUFACTURING FLEXIBLE DISPLAY PANEL AND DISPLAY DEVICE

(71) Applicant: WuHan TianMa Micro-electronics CO., LTD, Wuhan (CN)

(72) Inventors: Chuan Liu, Wuhan (CN); Qianglong Li, Wuhan (CN)

(73) Assignee: WUHAN TIANMA MICRO-ELECTRONICS CO., LTD, Wuhan (CN)

( * ) Notice: Subject to any disclaimer, the term of this patent is extended or adjusted under 35 U.S.C. 154(b) by 0 days.

(21) Appl. No.: 16/823,029

(22) Filed: Mar. 18, 2020

(65) Prior Publication Data
US 2021/0167305 A1 Jun. 3, 2021

(30) Foreign Application Priority Data

Nov. 29, 2019 (CN) .......................... 201911204866.3

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3248* (2013.01); *H01L 51/56* (2013.01); *H01L 2227/323* (2013.01); *H01L 2251/5338* (2013.01); *H01L 2251/566* (2013.01)

(58) Field of Classification Search
CPC .................................................. H01L 51/0097
See application file for complete search history.

(56) References Cited

U.S. PATENT DOCUMENTS

| 2018/0040849 | A1* | 2/2018 | Ishida | ...................... H01L 51/56 |
| 2018/0062090 | A1* | 3/2018 | Kim | .................... H01L 51/0097 |
| 2018/0217639 | A1* | 8/2018 | Jones | ..................... G06F 1/1652 |
| 2019/0148653 | A1* | 5/2019 | Chen | ................... H01L 51/0097 345/173 |
| 2019/0363275 | A1* | 11/2019 | Ochi | ...................... H05B 33/04 |
| 2019/0363290 | A1* | 11/2019 | Watanabe | .............. H05B 33/04 |
| 2020/0133342 | A1* | 4/2020 | Choi | ..................... B32B 27/302 |

FOREIGN PATENT DOCUMENTS

| CN | 107342375 A | 11/2017 |
| CN | 107611162 A | 1/2018 |

* cited by examiner

*Primary Examiner* — Douglas M Menz
(74) *Attorney, Agent, or Firm* — Christensen O'Connor Johnson Kindness PLLC

(57) ABSTRACT

A flexible display panel, a manufacturing method thereof, and a display device are provided. The flexible display panel includes a first base layer, a stress relief layer, a second base layer, and at least one adhesion enhancing layer. The first base layer, the stress relief layer, and the second base layer are sequentially stacked along a light exiting direction of the flexible display panel. The at least one adhesion enhancing layer is provided between the stress relief layer and at least one of the first base layer or the second base layer in such a manner that the adhesion enhancing layer enhances adhesion there between.

17 Claims, 10 Drawing Sheets

FLEXIBLE DISPLAY PANEL, METHOD FOR MANUFACTURING FLEXIBLE DISPLAY PANEL AND DISPLAY DEVICE

CROSS-REFERENCE TO RELATED APPLICATIONS

The present application claims priority to Chinese Patent Application No. 201911204866.3, filed on Nov. 29, 2019, the content of which is incorporated herein by reference in its entirety.

TECHNICAL FIELD

The present disclosure relates to the field of display technologies, and in particular, to a flexible display panel, a method for manufacturing a flexible display panel, and a display device.

BACKGROUND

An OLED (Organic Light-Emitting Diode) is also known as an organic electric laser display and organic light-emitting semiconductor. Compared with an LCD (liquid crystal display panel), an OLED display panel is thinner and lighter and has higher brightness, lower power consumption, faster response, higher definition, better flexibility and higher light emitting efficiency, so that it can meet new demands of consumers for display technologies and has gradually become a research hotspot of major manufacturers. Due to its thinness and lightness and flexibility, research on foldable and bendable display panels has also been promoted. It is required for the flexible display panel to satisfy that it can still ensure structural stability and reliability after multiple bending or folding during use.

A phenomenon of film peeling after multiple bending or folding still exist in the flexible display panel, which affects a performance of the flexible display device.

SUMMARY

In a first aspect, an embodiment of the present disclosure provides a flexible display panel, and the flexible display panel includes a flexible substrate, and the flexible substrate includes a first base layer, a stress relief layer, a second base layer, and at least one adhesion enhancing layer. The first base layer, the stress relief layer, and the second base layer are sequentially stacked along a light exiting direction of the flexible display panel. The at least one adhesion enhancing layer is provided between the stress relief layer and at least one of the first base layer or the second base layer in such a manner that the at least one adhesion enhancing layer enhances adhesion therebetween.

Based on the same inventive concept, in a second aspect, an embodiment of the present disclosure further provides a method for manufacturing a flexible display panel, and the method includes: manufacturing a display panel motherboard, the display panel motherboard including a plurality of flexible display panels and a waste material area surrounding each of the plurality of flexible display panels, the flexible display panel including a display area and a non-display area, the waste material area including a first cutting area and a second cutting area, the second cutting area surrounding the flexible display panel, and the first cutting area surrounding the second cutting area; a manufacturing process of the display panel motherboard includes manufacturing a flexible substrate; cutting the display panel motherboard along a first cutting line in the first cutting area to form a plurality of flexible display panels to be cut; and cutting each of the plurality of flexible display panels to be cut along a second cutting line in the second cutting area to form the flexible display panel. And the manufacturing a flexible substrate includes manufacturing a first base layer, a stress relief layer, and a second base layer in sequence; and manufacturing at least one adhesion enhancing layer in such a manner that the at least one adhesion enhancing layer is provided between the stress relief layer and at least one of the first base layer or the second base layer.

Based on the same inventive concept, in a third aspect, an embodiment of the present disclosure provides a display device including the display panel provided by an embodiment of the present disclosure.

BRIEF DESCRIPTION OF DRAWINGS

In order to more clearly illustrate technical solutions of embodiments of the present disclosure, the accompanying drawings used in the embodiments are briefly described below. The drawings described below are part of the embodiments of the present disclosure.

DESCRIPTION OF EMBODIMENTS

Figure 1:
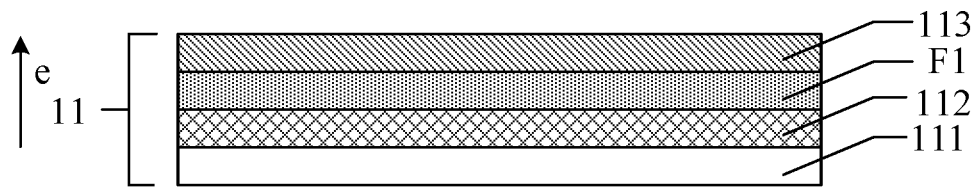
FIG. 1 is a schematic diagram of a film structure of a flexible display panel according to an embodiment of the present disclosure.

In order to better understand technical solutions of the present disclosure, the embodiments of the present disclosure are described in detail with reference to the drawings. It should be clear that the described embodiments are part of the embodiments of the present disclosure rather than all of the embodiments.

The terms used in the embodiments of the present disclosure are for describing exemplary embodiments and not intended to limit the present disclosure. Unless otherwise noted in the context, the expressions "a", "an", "the" and "said" in singular form in the embodiments and appended claims of the present disclosure are also intended to represent a plural form.

As used herein, the expression "at least one of A or B" and includes the following: A alone, B alone, and A and B. Unless stated otherwise, one or more features of any embodiment may be combined with one or more features of one or more other embodiments to form additional embodiments.

The present disclosure includes solutions to increase adhesion and provide a groove.

An embodiment of the present disclosure provides a flexible display panel. The flexible display panel includes a flexible substrate. The flexible substrate includes a first base layer, a stress relief layer, and a second base layer that are sequentially stacked along a light exiting direction of the flexible display panel. An adhesion enhancing layer is provided between the stress relief layer and at least one of the first base layer or the second base layer in such a manner that the adhesion enhancing layer enhances adhesion therebetween. For example, the adhesion enhancing layer is provided between the stress relief layer and the first base layer in such a manner that the adhesion enhancing layer enhances adhesion therebetween. For another example, the adhesion enhancing layer is provided between the stress relief layer and the second base layer in such a manner that the adhesion enhancing layer enhances adhesion therebetween. For another example, at least one adhesion enhancing layer is provided between the stress relief layer and the first base layer, and at least one adhesion enhancing layer is provided between the stress relief layer and the second base layer. The stress relief layer can release stress during a bending process of the flexible display panel, to avoid local stress concentration when bending the flexible display panel, that is, to ensure uniform load of the panel during the bending process.

When improving bending resistance of the flexible display panel, the stress relief layer is added between the first base layer and the second base layer to release the bending stress via the stress relief layer, thereby avoiding stress concentration. After bending simulation tests is performed many times, a phenomenon of film peeling easily occurs between the stress relief layer and the base layer (including the first base layer and the second base layer). Because the base layer and the stress relief layer are made of different material, physical properties of the base layer and the stress relief layer are greatly different, resulting in a poor performance of the stress relief layer when contacting a contact surface of the base layer. The physical properties include crystalline states, anisotropy, and so on. When the flexible display panel is bent, the stress relief layer and the base layer are respectively subjected to different stresses at a same position, such that the adhesion between the contact surfaces of the stress relief layer and the base layer is reduced and the film peeling occurs. A flexible display panel is proposed to improve a bonding performance between the base layer and the stress relief layer by adding the adhesion enhancing layer between the base layer and the stress relief layer, thereby avoiding the film peeling after multiple bending.

In an embodiment, a physical property of the adhesion enhancing layer are between a physical property of the stress relief layer and the base layer. Then a difference of the physical properties of the adhesion enhancing layer and the stress relief layer is relatively small, and an adhesion between the adhesion enhancing layer and the stress relief layer is larger than an adhesion between the stress relief layer and the base layer; at the same time, an adhesion between the adhesion enhancing layer and the base layer is larger than an adhesion between the stress relief layer and the base layer. That is, both the adhesion between the adhesion enhancing layer and the stress relief layer and the adhesion between the adhesion enhancing layer and the base layer are better, so that the bonding performance between the films of the flexible substrate can be improved to avoid the film peeling caused after multiple bending.

In an embodiment of the present disclosure, the base layer is made at least partially of one or more of polyimide film material (PI), polyethylene terephthalate material (PET), or polyurethane. The first base layer and the second base layer can be made of a same material or different materials.

In an embodiment of the present disclosure, the stress relief layer is made at least partially of at least one of silicon oxide, silicon nitride, or silicon oxynitride.

In some embodiments, the adhesion enhancing layer is made at least partially of a metal material or a semiconductor material. In the flexible substrate, the base layer usually adopts an organic polymer material. Generally, the organic polymer material has no crystalline state and has no anisotropy. The materials of silicon oxide, silicon nitride or silicon oxynitride each are crystalline and have relatively strong anisotropy. However, both the metal material and the semiconductor material have certain anisotropy, so the physical property of the adhesion enhancing layer made at least partially of the metal material or the semiconductor material is between that of the base layer and that of the stress relief layer. The metal material or the semiconductor material can interact with the materials of the silicon oxide, silicon nitride, or silicon oxynitride through intermolecular forces, and the adhesion between layers is relatively strong. The metal material or the semiconductor material can also interact with the organic polymer through intermolecular forces, and the adhesion between layers is also relatively strong. Therefore, providing the adhesion enhancing layer ensures that both the adhesion between the adhesion enhancing layer and the stress relief layer and the adhesion between the adhesion enhancing layer and the base layer are relatively good, so that the bonding performance between the films of the flexible substrate can be improved, and the film peeling can be prevented after multiple bending.

In an embodiment, the semiconductor material includes at least one of single crystal silicon, polysilicon, or amorphous silicon, and the metal material includes one or more of molybdenum, titanium, or aluminum. In actual products, an appropriate semiconductor material or metal material can be selected, based on specific design requirements as well as specific material selection of the base layer and specific material selection of the stress relief layer, to improve the bonding performance between the films.

In an embodiment, the adhesion enhancing layer is provided between the stress relief layer and the second base layer. FIG. 1 is a schematic diagram of a film structure of a flexible display panel according to an embodiment of the present disclosure. As shown in FIG. 1, the flexible display panel includes a flexible substrate 11, and the flexible substrate 11 includes a first base layer 111, a stress relief layer 112, and a second base layer 113 that are sequentially stacked along a light exiting direction e of the flexible display panel. The light exiting direction e is a light exiting direction of a light emitting element of the flexible display panel, and light emitted from the light emitting element forms images displaying on the display panel after being emitted in the light exiting direction e. The adhesion enhancing layer includes a first adhesion enhancing layer F1, and the first adhesion enhancing layer F1 is located between the stress relief layer 112 and the second base layer 113. In this embodiment, both a bonding between the first adhesion enhancing layer and the second base layer and a bonding between the first adhesion enhancing layer and the stress relief layer each are stronger than a bonding between the second base layer and the stress relief layer, so that the bending resistance of the flexible substrate can be enhanced, which reduces a risk of the film peeling caused by multiple bending.

Figure 2:
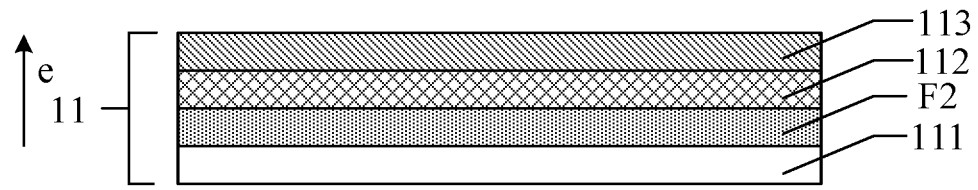
FIG. 2 is a schematic diagram of a film structure of a flexible display panel according to an embodiment of the present disclosure.

In another embodiment, the adhesion enhancing layer is provided between the stress relief layer and the first base layer. FIG. 2 is a schematic diagram of a film structure of a flexible display panel according to an embodiment of the present disclosure. As shown in FIG. 2, the flexible display panel includes a flexible substrate 11, and the flexible substrate 11 includes a first base layer 111, a stress relief layer 112, and a second base layer 113 which are sequentially stacked along a light exiting direction of the flexible display panel. The adhesion enhancing layer includes a second adhesion enhancing layer F2, and the second adhesion enhancing layer F2 is located between the stress relief layer 112 and the first base layer 111. In this embodiment, both the bonding between the second adhesion enhancing layer and the first base layer and the bonding between the second adhesion enhancing layer and the stress relief layer each are stronger than the bonding between the first base layer and the stress relief layer, so that the bending resistance of the flexible substrate can be enhanced, which reduces a risk of the film peeling caused by multiple bending.

Figure 3:
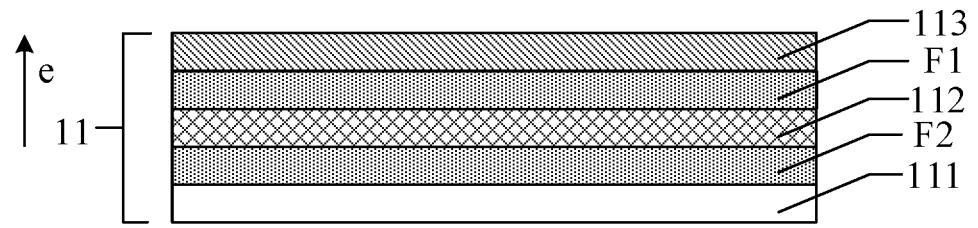
FIG. 3 is a schematic diagram of a film structure of a flexible display panel according to an embodiment of the present disclosure.

In another embodiment, the adhesion enhancing layer is provided between the stress relief layer and the second base layer, and is provided between the stress relief layer and the first base layer. FIG. 3 is a schematic diagram of a film structure of a flexible display panel according to an embodiment of the present disclosure. As shown in FIG. 3, the flexible substrate 11 includes a first base layer 111, a stress relief layer 112, and a second base layer 113 which are sequentially stacked. A first adhesion enhancing layer F1 is provided between the stress relief layer 112 and the second base layer 113, and a second adhesion enhancing layer F2 is provided between the stress relief layer 112 and the first base layer 111. In this embodiment, both the first adhesion enhancing layer and the second adhesion enhancing layer are provided, so that it can ensure better adhesion performance between the films and improve overall structural strength, to enhance the bending resistance of the substrate plate and reduce a risk of the film peeling caused by multiple bending.

In the embodiment of the present disclosure, in order to improve the bonding performance between the films and the bending resistance of the panel, the bonding performance between the adhesion enhancing layer and the base layer is further improved.

Figure 4:
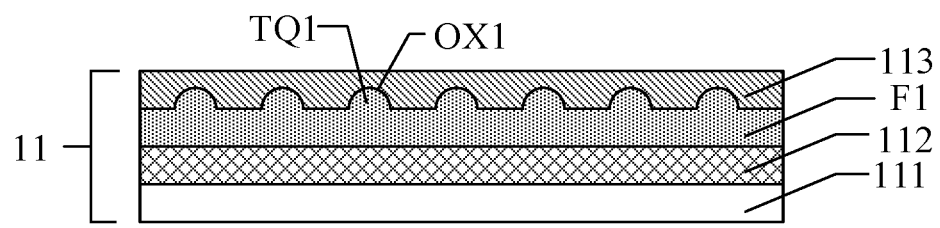
FIG. 4 is a schematic diagram of a film structure of a flexible display panel according to an embodiment of the present disclosure.

FIG. 4 is a schematic diagram of a film structure of a flexible display panel provided by an embodiment of the present disclosure. In an embodiment, as shown in FIG. 4, the first adhesion enhancing layer F1 includes a first protruding portion TQ1, the first protruding portion TQ1 protrudes towards the second base layer 113 from the first adhesion enhancing layer F1, the second base layer 113 includes a first recessed portion OX1, and the first recessed portion OX1 is used to receive the first protruding portion TQ1, that is, the first recessed portion OX1 and the first protruding portion TQ1 are contact and bonded with each other. A shape of the first protruding portion TQ1 can be a regular shape or an irregular shape. The shape of the first protruding portion TQ1 in the embodiment of the present disclosure is merely a simplified illustration and not intended to limit the present disclosure. Corresponding arrangements of the first protruding portion and the first recessed portion can achieve that a surface of the first adhesion enhancing layer and a surface of the second base layer that are contact with each other each are an uneven surface, which is equivalent to that a part of the structure of the first adhesion enhancing layer is embedded inside the second base layer and a part of the structure of the second base layer is embedded inside the first adhesion enhancing layer, so that the contact area between the first adhesion enhancing layer and the second base layer can be increased, thereby improving the bonding strength between the first adhesion enhancing layer and the second base layer and reducing the risk of the film peeling caused by multiple bending.

In the manufacturing process of the flexible display panel, after forming a material layer of the first adhesion enhancing layer, the material layer of the first adhesion enhancing layer can be etched to form the first adhesion enhancing layer having the first protruding portion; and then a second base layer is manufactured on the first adhesion enhancing layer, and the second base layer is in contact and bonded with the first adhesion enhancing layer, so as to form a corresponding first recessed portion on the second base layer to receive the first protruding portion.

In an embodiment, in an aspect where a second adhesion enhancing layer is provided between the stress relief layer and the first base layer, a corresponding protruding portion and recessed portion can also be provided, to achieve that the surface of the second adhesion enhancing layer and the surface of the first base layer that are in contact with each other each are an uneven surface, so that the contact area between the second adhesion enhancing layer and the first base layer can be increased, and the bonding performance can be improved.

Figure 5:
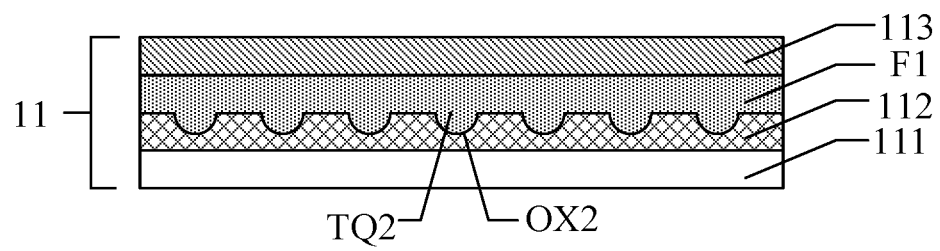
FIG. 5 is a schematic diagram of a film structure of a flexible display panel according to an embodiment of the present disclosure.

FIG. 5 is a schematic diagram of a film structure of a flexible display panel provided by an embodiment of the present disclosure. As shown in FIG. 5, the first adhesion enhancing layer includes a second protruding portion TQ2, and the second protruding portion TQ2 protrudes towards the first stress relief layer 112 from the adhesion enhancing layer. The stress relief layer 112 includes a second recessed portion OX2, and the second recessed portion OX2 is used to receive the second protruding portion TQ2. In the drawing, the case where the first adhesion enhancing layer includes the second protruding portion is for illustration. A shape of the second protruding portion in the embodiment of the present disclosure is a simplified illustration and not intended to limit the present disclosure. Corresponding arrangements of the second protruding portion and the second recessed portion can achieve that a surface of the adhesion enhancing layer and a surface of the stress relief layer that are contact with each other each are an uneven surface, which is equivalent to that a part of the structure of the first adhesion enhancing layer is embedded inside the stress relief layer and a part of the structure of the stress relief layer is embedded inside the adhesion enhancing layer, so that the contact area between the adhesion enhancing layer and the stress relief layer can be increased, thereby improving the bonding strength between the adhesion enhancing layer and the stress relief layer and reducing the risk of the film peeling caused by multiple bending.

A formation manner of the second protruding portion and the second recessed portion can be understood with reference to the formation manner of the first protruding portion and the first recessed portion, and details are not repeated herein.

In an embodiment, the adhesion enhancing layer can include the first protruding portion and the second protruding portion, which can improve the bonding strength between the adhesion enhancing layer and the base layer and also improve the bonding strength between the adhesion enhancing layer and the stress relief layer.

Figure 6:
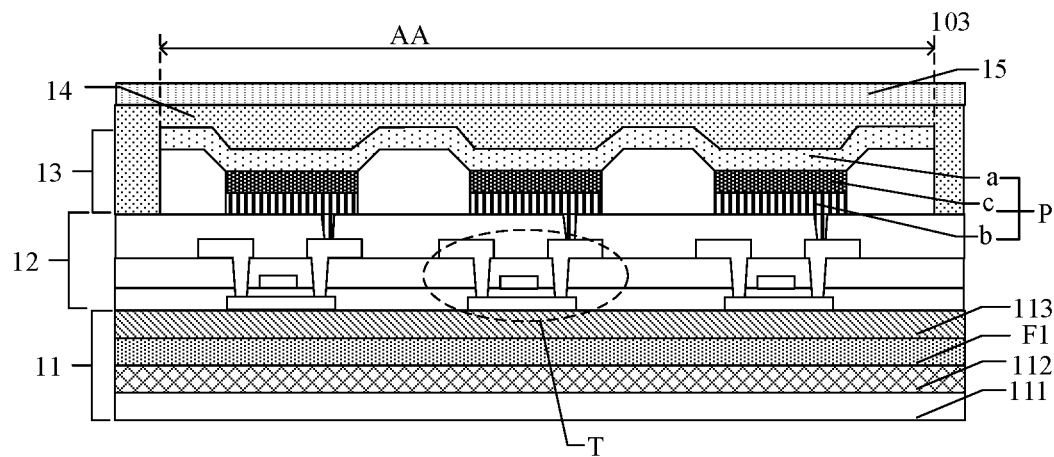
FIG. 6 is a schematic diagram of a film structure of a flexible display panel according to an embodiment of the present disclosure.

FIG. 6 is a schematic diagram of a film structure of a flexible display panel provided by an embodiment of the present disclosure. In an embodiment, as shown in FIG. 6, the flexible display panel further includes an array layer 12 located at a side of the second base layer 113 facing away from the first base layer 111 and a display layer 13 is located at a side of the array layer 12 facing away from the flexible substrate 11. The array layer 12 includes multiple pixel circuits located in a display area AA. Actual pixel circuits are very complicated, and one transistor T in the pixel circuit is illustrated in the drawing. The transistor in the drawing is illustrated by a top-gate structure. Alternatively, the transistor may be a bottom-gate structure. The display layer 13 includes multiple light emitting elements P located in the display area. The light emitting element is electrically connected to the pixel circuit, and the pixel circuit is configured to drive the light emitting element P to emit light. The light emitting element P includes a first electrode b, a light emitting layer c, and a second electrode a that are stacked in sequence. It is illustrated in the drawing that the transistor T in the pixel circuit is electrically connected to the first electrode b of the light emitting element P. In an embodiment, an encapsulation structure 14 is further provided on the display layer 13. The encapsulation structure 14 is used to protect the light emitting element P in the display layer 13, to prevent damage caused by water and oxygen and increase a service life of the light-emitting device P. The encapsulation structure 14 can be a thin film encapsulation and includes at least one inorganic encapsulation layer and at least one organic encapsulation layer. A protective layer 15 is further provided on the encapsulation structure 14. In the drawing, it is illustrated with the flexible substrate 11 as the flexible substrate in the embodiment in FIG. 1.

In the related art, an electrostatic test needs to be carried out on the panel before it leaves a factory. However, the produced flexible display panel in the related art has a problem that an edge of the display area has abnormal brightness during the electrostatic test. The structure of the flexible display panel is improved to solve the problem of the abnormal brightness of the edge of the display area during the electrostatic test.

Figure 7:
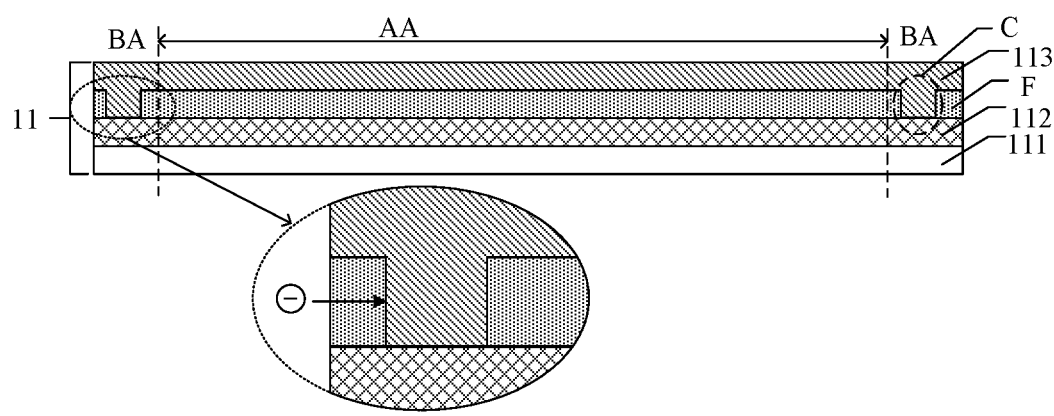
FIG. 7 is a schematic diagram of a film structure of a flexible display panel according to an embodiment of the present disclosure.

FIG. 7 is a schematic diagram of a film structure of a flexible display panel provided by an embodiment of the present disclosure. In an embodiment, as shown in FIG. 7, the flexible display panel includes a display area AA and a non-display area BA; a simplified illustration is made, and the flexible substrate 11 arranged in the panel is illustrated, and the flexible substrate 11 includes a portion located in the display area AA and a portion located in the non-display area BA. The adhesion enhancing layer F has a groove C arranged in the non-display area BA, and the groove C penetrates the adhesion enhancing layer F in a direction perpendicular to the flexible substrate.

In the flexible display panel provided by the embodiment of the present disclosure, the adhesion enhancing layer is provided in the flexible substrate, and the adhesion enhancing layer can improve the bending resistance of the flexible substrate, so as to improve the problem of film peeling caused by multiple bending. The adhesion enhancing layer is made at least partially of a material having a certain anisotropy, such as the semiconductor material or the metal material. The adhesion enhancing layer has a certain conductivity, and charges generated in the manufacturing and cutting processes of the flexible display panel will be transferred in the adhesion enhancing layer, i.e., charge lateral transferring as shown in FIG. 7, and will be transferred to the display area, while the pixel circuit in the display area includes a transistor structure (referring to the description in FIG. 6), and charges introduced into the display area from the adhesion enhancing layer can affect a state of the transistor in the pixel circuit, to cause the transistor to be turned on abnormally, so as to cause the light emitting element to emit light abnormally. Based on the above considerations, the flexible display panel in the embodiment of the present disclosure is proposed and a groove penetrating the adhesion enhancing layer in the adhesion enhancing layer located in the non-display area is manufactured, so that the groove can block the transferring path of charges to prevent charges generated during the manufacturing process from being introduced into the display area from the adhesion enhancing layer to exert an adverse effect on the transistor in the display area. Thus, the problem of the abnormal brightness of the edge of the display area during the electrostatic test is solved.

In the manufacturing process of flexible display panels, usually, first a display panel motherboard is produced, and the display panel motherboard includes multiple flexible display panels; then, the display panel motherboard is cut for a first time to form multiple flexible display panels to be cut; then, the flexible display panel to be cut is cut a second time to form a flexible display panel. In the cutting process, electrostatic charges may be generated at an edge position of the cutting due to cutting friction; in addition, after the first cutting is completed, a film fixing process and a film tearing process are performed on the flexible display panel to be cut, and these manufacturing processes also generate electrostatic charges. The flexible display panel provided by an embodiment of the present disclosure is provided with a groove on the adhesion enhancing layer located in the non-display area, so that both the charges generated by the cutting process and the charges generated by the film fixing and film tearing processes can be blocked outside the display area by the groove, thereby preventing the charges from being introduced into the display area from the adhesion enhancing layer to cause defects in the transistor in the display area, so as to solve the problem of the abnormal brightness of the edge of the display area during the electrostatic test.

In FIG. 7, a case of manufacturing the groove C on the adhesion enhancing layer F located between the stress relief layer 112 and the second base layer 113 is illustrated. In the manufacturing process of the panel, the fabrication of the material layer of the adhesion enhancing layer is first completed, and then the material layer of the adhesion enhancing layer is etched to form an adhesion enhancing layer having a groove; then, the second base layer is formed on the adhesion enhancing layer, and the second base layer fills the groove.

In an embodiment, when the adhesion enhancing layer provided between the stress relief layer and the first base layer has a groove, during the manufacturing process of the panel, first, a material layer of an adhesion enhancing layer is formed on the first base layer; then, the material layer of the adhesion enhancing layer is etched to form an adhesion enhancing layer having a groove; then, a stress relief layer is formed on the adhesion enhancing layer, and the stress relief layer fills the groove.

The following embodiments are illustrated by a way of providing a groove on the adhesion enhancing layer located between the stress relief layer and the second base layer, and an embodiment in which a groove is provided on the adhesion enhancing layer disposed between the stress relief layer and the first base layer can be understood by reference.

Figure 8:
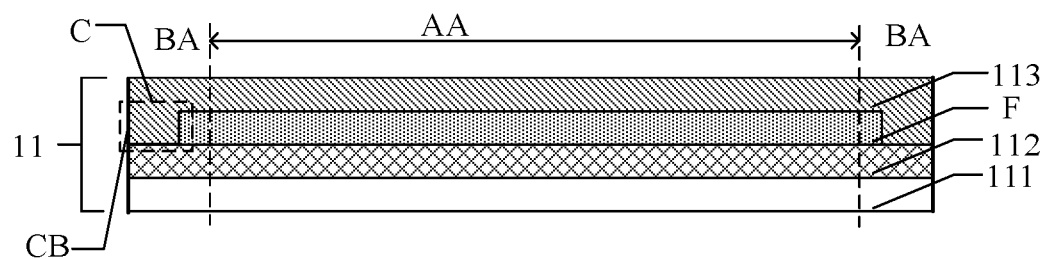
FIG. 8 is a schematic diagram of a film structure of a flexible display panel according to an embodiment of the present disclosure.

FIG. 8 is a schematic diagram of a film structure of a flexible display panel provided by an embodiment of the present disclosure. In an embodiment, as shown in FIG. 8, an edge of the flexible display panel has a sidewall CB, the sidewall CB being a surface of a side edge of the flexible display panel, and the sidewall CB does not expose the adhesion enhancing layer F. That is, as illustrated, the adhesion enhancing layer F includes a groove C at a position close to the sidewall CB, so as to achieve that the sidewall does not expose the adhesion enhancing layer F. In this embodiment, the groove C can block the transferring of the charges, which are generated in the manufacturing process of the display panel after being cut, from the adhesion enhancing layer to the display area, and it can also block the charges in the environment from entering the adhesion enhancing layer from the sidewall of the display panel after the fabrication is completed.

Figure 9:
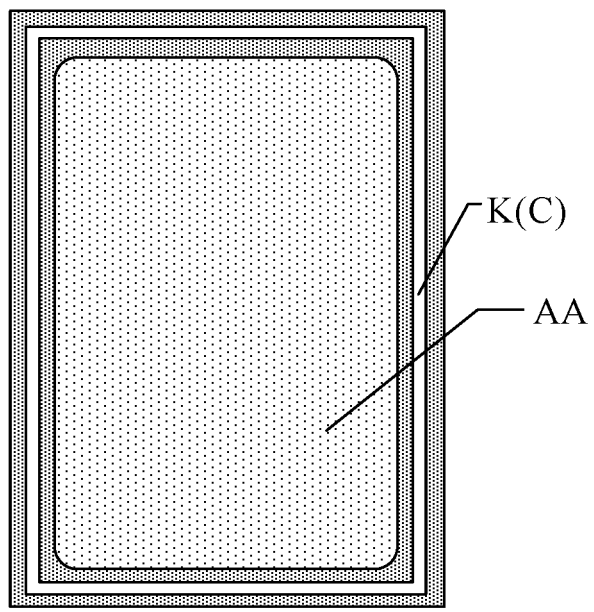
FIG. 9 is a schematic top view of a flexible display panel according to an embodiment of the present disclosure.

FIG. 9 is a schematic top view of the flexible display panel provided by an embodiment of the present disclosure. In an embodiment, as shown in FIG. 9, the groove C is a through groove K surrounding the display area AA. The through groove K is arranged around the display area and can block a charge transferring path in each direction around the display area, to prevent the charges from being transferred from the adhesion enhancing layer to the display area and to avoid a negative impact of the charges on the transistor in the display area, thereby being capable of solve a problem of an abnormal brightness of the edge in the display area during an electrostatic test.

Figure 10:
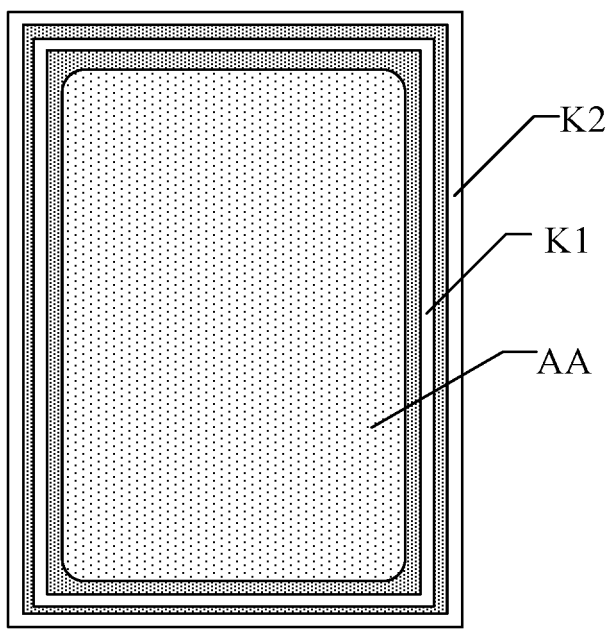
FIG. 10 is a schematic top view of a flexible display panel according to an embodiment of the present disclosure.

FIG. 10 is a schematic top view of a flexible display panel provided by an embodiment of the present disclosure. In an embodiment, as shown in FIG. 10, the through groove includes at least a first through groove K1 and a second through groove K2. The first through groove K1 and the second through groove K2 do not communicate with each other, and the first through groove K1 is located at a side of the second through groove K2 close to the display area AA. In the panel cutting process, cutting errors in the cutting can occur. The first through groove and the second through groove provided in this embodiment are equivalent to double guarantee to block the transferring path of the charges in the adhesion enhancing layer. When an error occurs in the cutting process and the second through groove is cut off to cause a cutting edge to expose the adhesion enhancing layer, the first through groove located at the side of the second through groove close to the display area can still block the charges from being transferred to the display area, so as to ensure that the charges are blocked outside the display area to avoid the negative impact of the charges on the transistor in the display area, thereby solving the problem of the abnormal brightness of the edge in the display area during an electrostatic test.

Figure 11:
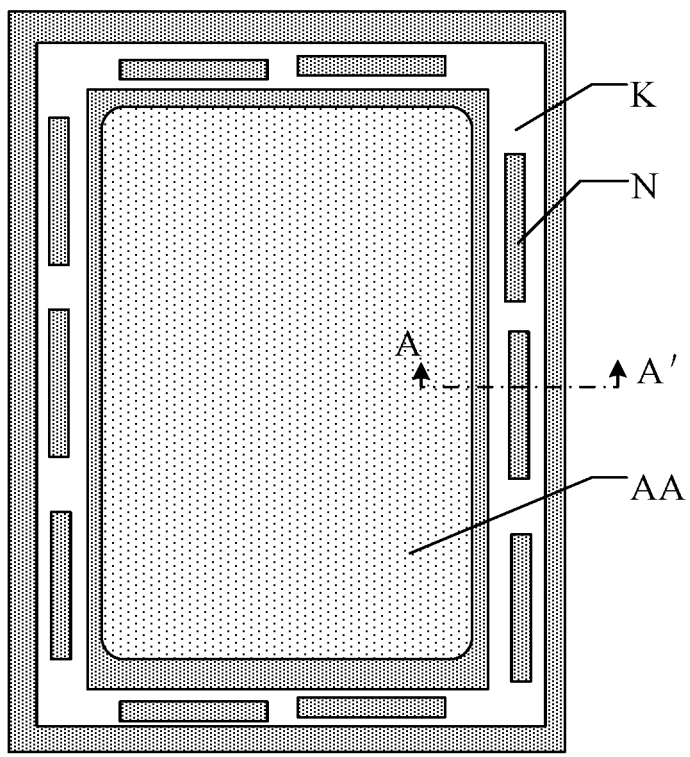
FIG. 11 is a schematic top view of a flexible display panel according to an embodiment of the present disclosure.
Figure 12:
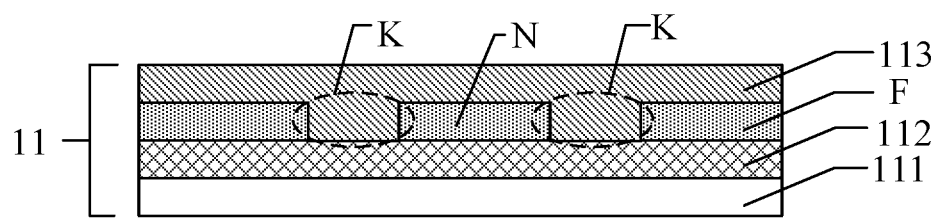
FIG. 12 is a schematic cross-sectional view taken along tangent line A-A' in FIG. 11.
Figure 13:
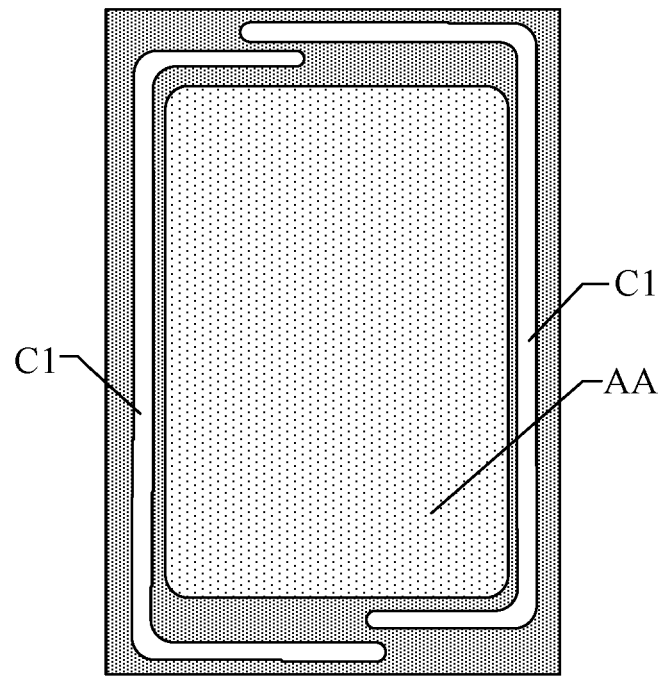
FIG. 13 is a schematic top view of a flexible display panel according to an embodiment of the present disclosure.

In an embodiment, FIG. 11 is a schematic top view of the flexible display panel provided by an embodiment of the present disclosure. FIG. 12 is a schematic cross-sectional view taken along tangent line AA' in FIG. 11. Referring to FIG. 11 and FIG. 13 in conjunction, the adhesion enhancing layer F further includes bonding portions N that are not connected to each other, and the bonding portion N is surrounded by the through groove K. The flexible substrate 11 of the flexible display panel is schematically illustrated in FIG. 12. The adhesion enhancing layer in this embodiment includes the bonding portion, and in the fabrication of the through groove of the adhesion enhancing layer, the through groove and the bonding portion can be simultaneously formed by etching the adhesion enhancing layer. Since the through groove penetrates the adhesion enhancing layer, the stress relief layer is in direct contact with the base layer at the through groove, and the adhesion between the stress relief layer and the base layer is poor. The bonding portion is a part of the adhesion enhancing layer, and the bonding strength between the bonding portion and the stress relief layer and the bonding strength between the bonding portion and the base layer are good. Therefore, with providing the bonding portion, it is possible to ensure the contact area between the adhesion enhancing layer and the base layer and the contact area between the adhesion enhancing layer and the stress-relief layer while providing the through groove to block the transferring path of the charges in the adhesion enhancing layer, so as to ensure reliability of the bonding performance of the films and to avoid film peeling caused by multiple bending.

FIG. 13 is a schematic top view of the flexible display panel provided by an embodiment of the present disclosure. In an embodiment, as shown in FIG. 13, the groove C includes at least two first grooves C1 surrounding the display area AA, and adjacent two first grooves C1 do not communicate with each other. In an embodiment, as shown in the drawing, edges of the two adjacent first grooves C1 overlap each other in the direction from the display area AA to the non-display area, and this embodiment can extend the charge transferring path by providing the at least two first grooves. Once there are charges entering the adhesion enhancing layer, the charges will be transferred along the edge of the first groove, which extends the time taken for the charges to move to the display area. During this transferring time, the charges in this part can be trapped by other holes and released, so that the charges will not transfer to the display area to affect the transistor in the display area, so as to solve the problem of abnormal brightness of the edge of the display area in the electrostatic test.

Figure 14:
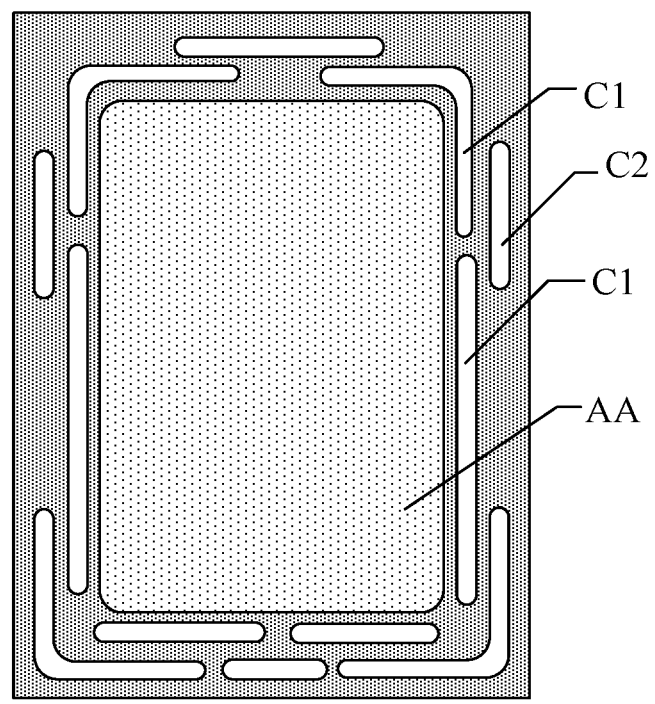
FIG. 14 is a schematic top view of a flexible display panel according to an embodiment of the present disclosure.

FIG. 14 is a schematic top view of the flexible display panel provided by an embodiment of the present disclosure. In an embodiment, as shown in FIG. 14, the groove further includes a second groove C2, and a gap between two adjacent first grooves C1 is blocked by the second groove C2 in a direction from the display area AA to the non-display area. In this embodiment, the second groove can shield the gap between the two first grooves, so as to extend the charge transferring path. Therefore, once there are charges entering the adhesion enhancing layer, the charges will be transferred along the edge of the groove, which extends the time taken for the charges to move to the display area. During this transferring time, the charges in this part can be trapped by other holes and released, so that the charges will not transfer to the display area to affect the transistor in the display area, thereby solving the problem of abnormal brightness of the edge of the display area in the electrostatic test.

Figure 15:
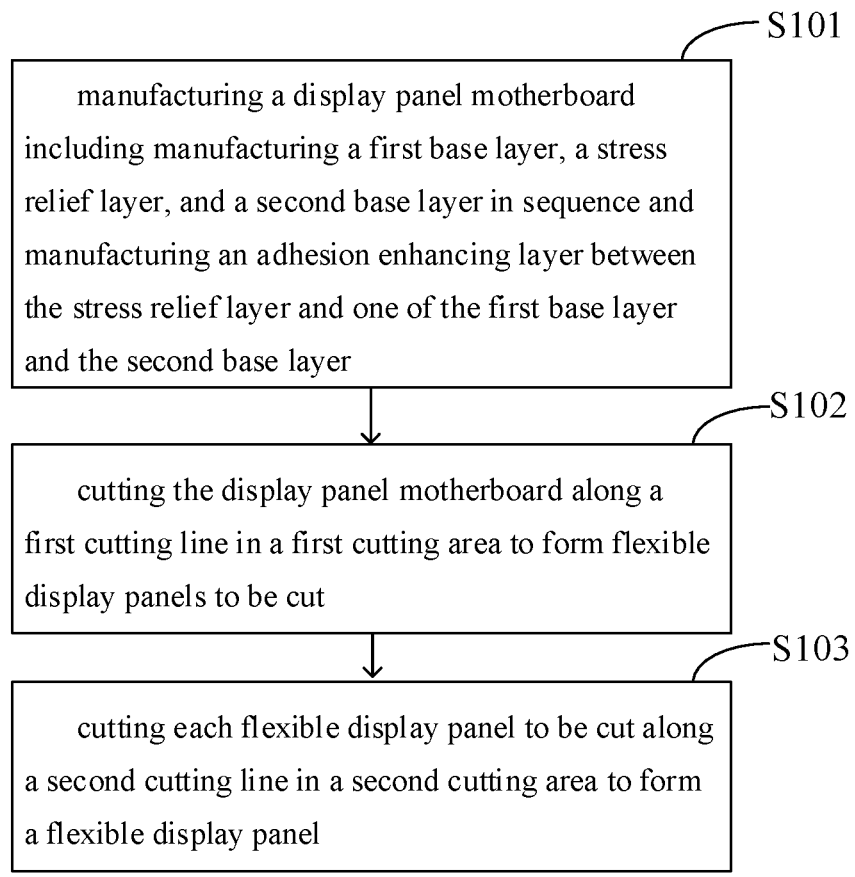
FIG. 15 is a flowchart of a method for manufacturing a flexible display panel according to an embodiment of the present disclosure.
Figure 16:
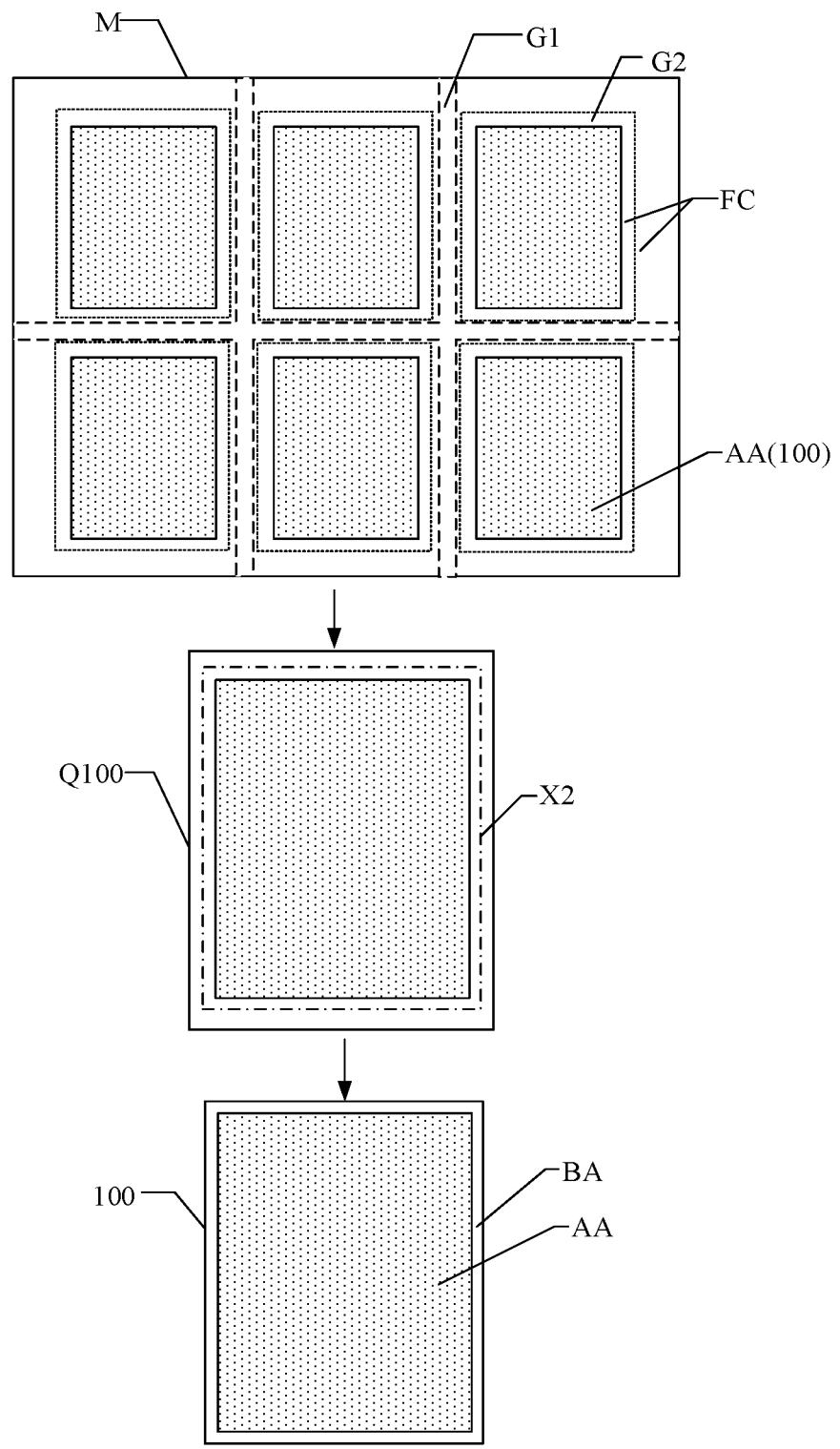
FIG. 16 is a schematic diagram of manufacturing a flexible display panel by using a manufacturing method provided in FIG. 15.
Figure 17:
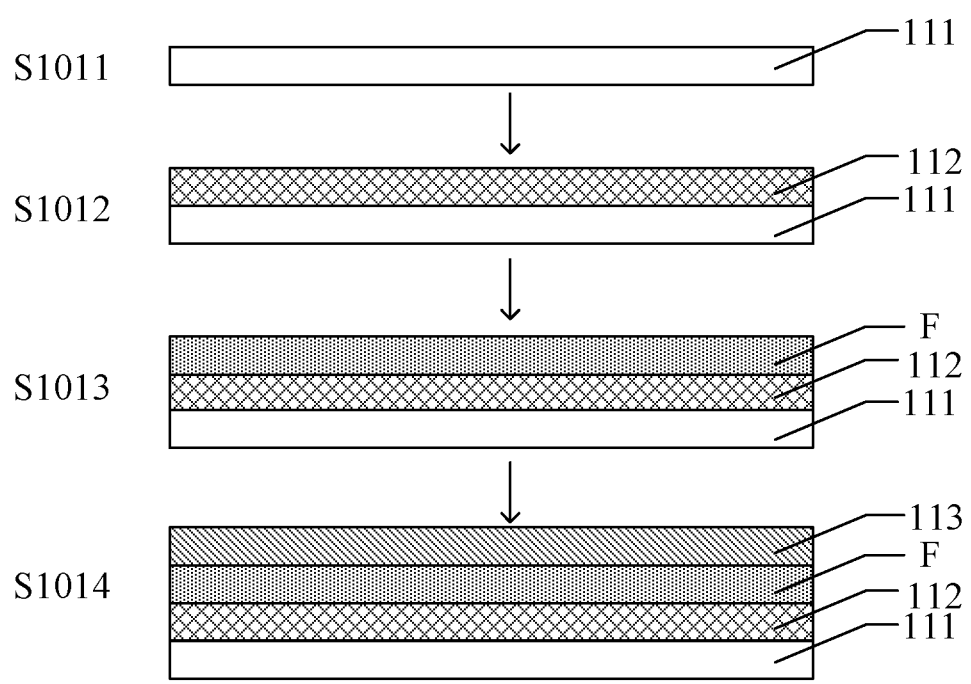
FIG. 17 is a schematic diagram of manufacturing a flexible substrate in a manufacturing method for a flexible display panel according to an embodiment of the present disclosure.

Based on the same inventive concept, an embodiment of the present disclosure further provides a method for manufacturing a flexible display panel, which can be used to manufacture the flexible display panel provided by any of the above embodiments. FIG. 15 is a flowchart of a method for manufacturing a flexible display panel according to an embodiment of the present disclosure. FIG. 16 is a schematic diagram of manufacturing a flexible display panel using the manufacturing method provided in FIG. 15. As shown in FIG. 15, the manufacturing method includes steps S101 to S103:

At step S101, a display panel motherboard is manufactured. As shown in FIG. 16, the display panel motherboard M includes multiple flexible display panels 100 and a waste material area FC surrounding the flexible display panel, the flexible display panel 100 has a display area AA and a non-display area. The display area AA of the panel is schematically illustrated. The waste material area FC includes a first cutting area G1 and a second cutting area G2, the second cutting area G2 surrounds the flexible display panel 100, and the first cutting area G1 surrounds the second cutting area G2. The manufacturing process of the display panel motherboard includes:

manufacturing a flexible substrate, including: sequentially manufacturing a first base layer, a stress relief layer, and a second base layer; and manufacturing an adhesion enhancing layer between the stress relief layer and at least one of the first base layer or the second base layer. FIG. 17 is a manufacturing schematic diagram of a flexible substrate in a manufacturing method for a flexible display panel according to an embodiment of the present disclosure. As shown in FIG. 17, the case in which one layer of an adhesion enhancing layer is manufactured between the second base layer and the stress relief layer is taken as an example. The method for manufacturing the flexible display panel includes steps S1011 to S1014.

At step S1011, a first base layer 111 is manufactured. In an embodiment, the first base layer is manufactured by a coating process.

At step S1012, the stress relief layer 112 is manufactured on the first base layer 111.

At step S1013, the adhesion enhancing layer F is manufactured on the stress relief layer 112.

At step S1014, a second base layer 113 is manufactured on the adhesion enhancing layer F.

In an embodiment, an adhesion enhancing layer can also be manufactured between the first base layer and the stress relief layer.

At step S102, the display panel motherboard M in the first cutting area G1 is cut along a first cutting line (a specific position of the cutting line is not shown in the drawing) to form multiple flexible display panels Q100 to be cut.

At step S103, the flexible display panel Q100 to be cut in the second cutting area G2 is cut along a second cutting line X2 to form the flexible display panel 100.

The structure of the flexible substrate of the flexible display panel manufactured by using the manufacturing method provided by the embodiment of the present disclosure can be described with reference to the embodiments corresponding to FIG. 1 to FIG. 3. For the flexible display panel manufactured by the embodiment of the present disclosure, in a flexible substrate, an adhesion enhancing layer is provided between the stress relief layer and at least one of the first base layer or the second base layer, and the adhesion enhancing layer is used to enhance the adhesion between the base layer and the stress relief layer. Both the adhesion between the adhesion enhancing layer and the stress relief layer and the adhesion between the adhesion enhancing layer and the base layer are relatively good, so that the bonding performance between the films of the substrate plate can be improved and the film peeling caused by multiple bending is prevented.

In some embodiments, manufacturing the adhesion enhancing layer between the stress relief layer and at least one of the first base layer or the second base layer, including: etching the adhesion enhancing layer to form a groove, the groove penetrating the adhesion enhancing layer, and the groove being located at a side of the second cutting area close to the display area. For the structure of the flexible display panel manufactured by this embodiment, reference can be made to the schematic diagrams in FIG. 7 to FIG. 14.

Figure 18:
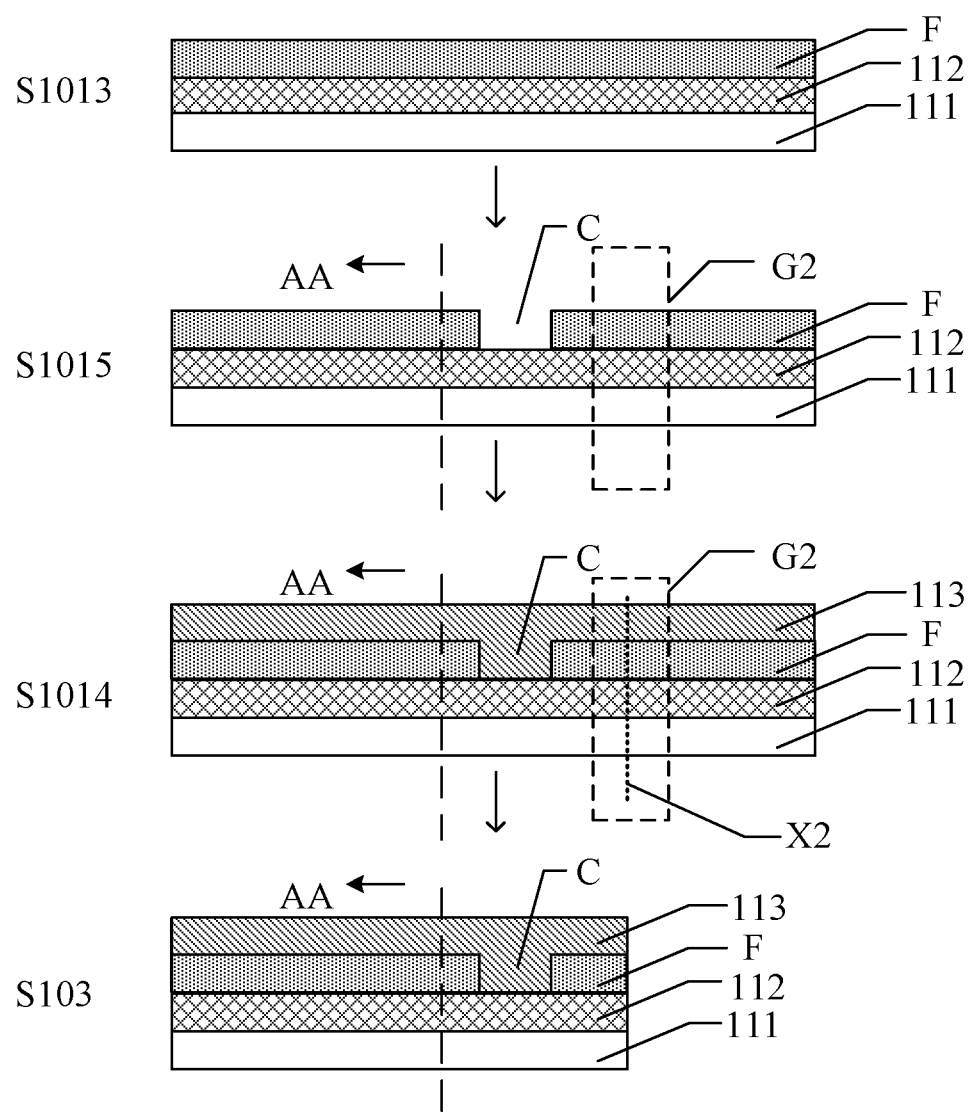
FIG. 18 is a schematic diagram of a method for manufacturing a flexible display panel according to an embodiment of the present disclosure.

In an embodiment, description is made by manufacturing an adhesion enhancing layer between the second base layer and the stress relief layer, and FIG. 18 is a schematic diagram of a manufacturing method for a flexible display panel according to an embodiment of the present disclosure.

As shown in FIG. 18, after the step S1013, the manufacturing method for the flexible display panel further includes a step S1015 at which the adhesion enhancing layer F is etched to form a groove C, the groove C penetrating the adhesion enhancing layer, and the groove C being located at a side of the second cutting area G2 close to the display area AA. A partial of the display motherboard is illustrated in the drawing.

The step S1014 includes forming the second base layer 113 on the adhesion enhancing layer F, the second base layer 113 filling the groove C.

At the step S103, the flexible display panel Q100 to be cut along the second cutting line G2 in the second cutting area G2 to form the flexible display panel 100 having a groove C in a non-display area.

The flexible display panel manufactured by using the manufacturing method provided in this embodiment is provided with a groove on the adhesion enhancing layer located in the non-display area of the panel, so that both the charges generated by the cutting process and the charges generated by the film fixing and film tearing processes can be blocked outside the display area by the groove to prevent the charges from being introduced into the display area from the adhesion enhancing layer to cause defects in the transistor in the display area, thereby solving the problem of abnormal brightness of the edge of the display area during the electrostatic test.

Figure 19:
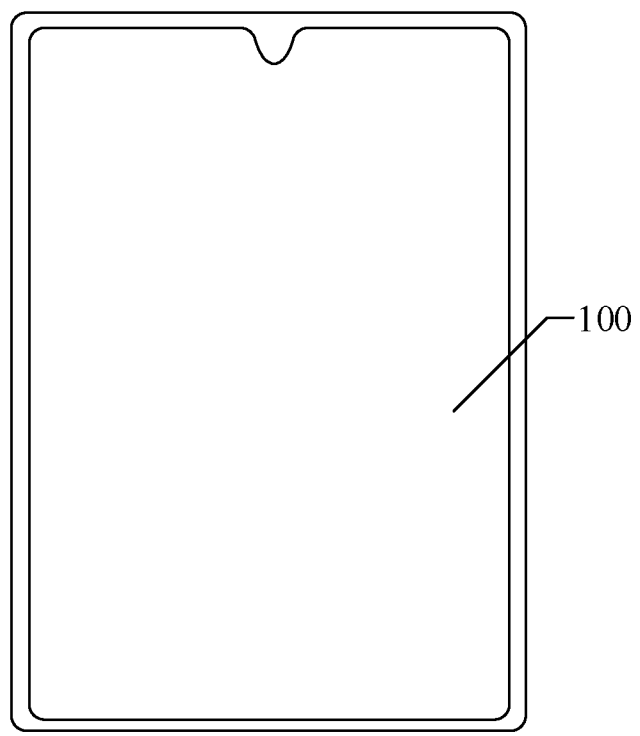
FIG. 19 is a schematic diagram of a display device according to an embodiment of the present disclosure.

Based on the same inventive concept, an embodiment of the present disclosure further provides a display device. FIG. 19 is a schematic diagram of a display device according to an embodiment of the present disclosure. As shown in FIG. 19, the display device includes the flexible display panel 100 provided by any embodiment of the present disclosure. The specific structure of the display panel 100 has been described in detail in the above embodiments, which is not repeated herein. Without doubt, the display device shown in FIG. 19 is merely a schematic illustration, and the display device can be any electronic apparatus having a display function, such as a mobile phone, a tablet computer, a notebook computer, an electronic paper book, or a television.

The above are exemplary embodiments of the present disclosure and are not intended to limit the present disclosure. Any modification, equivalent replacement, or improvement made within the spirit and principle of the present disclosure should be included in the scope of the present disclosure.

Finally, it should be noted that the above embodiments are used to illustrate the technical solution of the present disclosure but not to limit it; although the present disclosure has been described in detail with reference to the embodiments above, those of ordinary skill in the art should understand that they can still modify the technical solutions described in the embodiments above or make equivalent replacement of some or all of the technical features; whereas these modifications or replacements do not cause the essence of the corresponding technical solutions to depart from the scope of the technical solutions of the embodiments of the present disclosure.

What is claimed is:

1. A flexible display panel, comprising:
    a flexible substrate, the flexible substrate comprising a first base layer, a stress relief layer, a second base layer, and at least one adhesion enhancing layer,
    wherein the first base layer, the stress relief layer, and the second base layer are sequentially stacked along a light exiting direction of the flexible display panel;
    wherein the at least one adhesion enhancing layer is provided between the stress relief layer and at least one of the first base layer or the second base layer in such a manner that the at least one adhesion enhancing layer enhances adhesion there between;
    wherein the second base layer comprises at least one of polyimide film material (PI), polyethylene terephthalate material (PET), or polyurethane;
    wherein the stress relief layer comprises at least one of silicon oxide, silicon nitride, or silicon oxynitride; and
    wherein each of the at least one adhesion enhancing layer comprises a metal material or a semiconductor material, and the metal material comprises at least one of molybdenum, titanium, or aluminum.

2. The flexible display panel according to claim 1, wherein the at least one adhesion enhancing layer comprises a first adhesion enhancing layer located between the stress relief layer and the second base layer.

3. The flexible display panel according to claim 2, wherein the at least one adhesion enhancing layer further comprises a second adhesion enhancing layer located between the stress relief layer and the first base layer.

4. The flexible display panel according to claim 2, wherein the first adhesion enhancing layer comprises a first protruding portion protruding towards the second base layer from the first adhesion enhancing layer, and the second base layer comprises a first recessed portion for receiving the first protruding portion.

5. The flexible display panel according to claim 2, wherein the first adhesion enhancing layer comprises a second protruding portion protruding towards the stress relief layer from the first adhesion enhancing layer, and the stress relief layer comprises a second recessed portion for receiving the second protruding portion.

6. The flexible display panel according to claim 1, wherein the flexible display panel has a display area and a non-display area;
    wherein each of the at least one adhesion enhancing layer is provided with at least one groove, the at least one groove penetrates the at least one adhesion enhancing layer in a direction perpendicular to the flexible substrate, and at least one of the at least one groove is arranged in the non-display area.

7. The flexible display panel according to claim 6, wherein an edge of the flexible display panel has a sidewall, wherein the sidewall does not expose the at least one adhesion enhancing layer.

8. The flexible display panel according to claim 6, wherein the at least one groove comprises at least one through groove surrounding the display area.

9. The flexible display panel according to claim 8, wherein the at least one through groove comprises a first through groove and a second through groove, wherein the first through groove and the second through groove do not communicate with each other, and the first through groove is located at a side of the second through groove close to the display area.

10. The flexible display panel according to claim 8, wherein each of the at least one adhesion enhancing layer further comprises a plurality of bonding portions that is not connected with each other, and the plurality of bonding portions is surrounded by the at least one through groove.

11. The flexible display panel according to claim 6, wherein the at least one groove comprises at least two first grooves provided around the display area, and two adjacent first grooves of the at least two first grooves do not communicate with each other.

12. The flexible display panel according to claim 11, wherein the at least one groove further comprises a second groove, and a gap between the two adjacent first grooves is blocked by the second groove in a direction from the display area towards the non-display area.

13. The flexible display panel according to claim 1, wherein the semiconductor material comprises at least one of single crystal silicon, polysilicon, or amorphous silicon.

14. The flexible display panel according to claim 1, further comprising:
    an array layer located at a side of the second base layer facing away from the first base layer, the array layer comprising a plurality of pixel circuits located in a display area of the flexible display panel; and
    a display layer located at a side of the array layer facing away from the flexible substrate, the display layer comprising a plurality of light emitting elements located in the display area and electrically connected to the plurality of pixel circuits.

15. A method for manufacturing a flexible display panel, comprising:
    manufacturing a display panel motherboard, the display panel motherboard comprising a plurality of flexible display panels and a plurality of waste material areas, each of the plurality of waste material areas surrounding one of the plurality of flexible display panels, each of the plurality of flexible display panels having a display area and a non-display area, each of the plurality of waste material areas comprising a first cutting area and a second cutting area, the second cutting area surrounding one of the plurality of flexible display panels, the first cutting area surrounding the second cutting area, each of the plurality of flexible display panels comprising a flexible substrate; the flexible substrate comprising a first base layer, a stress relief layer, a second base layer, and at least one adhesion enhancing layer; the first base layer, the stress relief layer, and the second base layer being sequentially stacked along a light exiting direction of the flexible display panel; the at least one adhesion enhancing layer being provided between the stress relief layer and at least one of the first base layer or the second base layer in such a manner that the at least one adhesion enhancing layer enhances adhesion there between; the second base layer is made at least partially of one or more of polyimide film material (PI), polyethylene terephthalate material (PET), or polyurethane; the stress relief layer is made at least partially of at least one of silicon oxide, silicon nitride, or silicon oxynitride; and each of the at least one adhesion enhancing layer is made at least partially of a metal material or a semiconductor material, and the metal material comprises at least one of molybdenum, titanium, or aluminum;

wherein said manufacturing the display panel motherboard comprises:

manufacturing the flexible substrate, said manufacturing the flexible substrate comprising:

manufacturing the first base layer, the stress relief layer, and the a second base layer in sequence; and manufacturing the at least one adhesion enhancing layer in such a manner that the at least one adhesion enhancing layer is provided between the stress relief layer and at least one of the first base layer or the second base layer;

cutting the display panel motherboard along a first cutting line in the first cutting area to form the plurality of flexible display panels to be cut; and cutting each of the plurality of flexible display panels to be cut along a second cutting line in the second cutting area to form the flexible display panel.

16. The method according to claim 15, wherein said manufacturing the at least one adhesion enhancing layer in such a manner that the at least one adhesion enhancing layer is provided between the stress relief layer and one of the first base layer and the second base layer comprises:

etching each of the at least one adhesion enhancing layer to form a groove, the groove penetrating the at least one adhesion enhancing layer, and the groove being located at a side of the second cutting area close to the display area.

17. A display device, comprising the flexible display panel, wherein the display panel comprises:

a flexible substrate, the flexible substrate comprising a first base layer, a stress relief layer, a second base layer, and at least one adhesion enhancing layer, wherein the first base layer, the stress relief layer, and the second base layer are sequentially stacked along a light exiting direction of the flexible display panel;

wherein the at least one adhesion enhancing layer is provided between the stress relief layer and at least one of the first base layer or the second base layer in such a manner that the at least one adhesion enhancing layer enhances adhesion there between;

wherein the second base layer is made at least partially of at least one of polyimide film material (PI), polyethylene terephthalate material (PET), or polyurethane;

wherein the stress relief layer is made at least partially of at least one of silicon oxide, silicon nitride, or silicon oxynitride; and wherein each of the at least one adhesion enhancing layer is made at least partially of a metal material or a semiconductor material, and the metal material comprises at least one of molybdenum, titanium, or aluminum.

* * * * *